United States Patent [19]

van der Putten

[11] Patent Number: 5,527,734

[45] Date of Patent: Jun. 18, 1996

[54] METHOD OF MANUFACTURING A SEMICONDUCTOR DEVICE BY FORMING PYRAMID SHAPED BUMPS USING A STABILIZER

[75] Inventor: Andreas M. T. P. van der Putten, Eindhoven, Netherlands

[73] Assignee: U.S. Philips Corporation, New York, N.Y.

[21] Appl. No.: 764,662

[22] Filed: Sep. 24, 1991

[30] Foreign Application Priority Data

Oct. 5, 1990 [NL] Netherlands ............................ 9002163

[51] Int. Cl.[6] ................................................. H01L 21/441
[52] U.S. Cl. ............................ 437/183; 437/230; 437/947
[58] Field of Search ................................... 437/183, 230, 437/187, 245, 947; 427/304, 438, 443.1

[56] References Cited

U.S. PATENT DOCUMENTS

| Re. 29,285 | 6/1977 | Christini et al. | 427/438 |
| 4,028,200 | 6/1977 | Dockus | 427/438 |
| 4,122,215 | 10/1978 | Vratny | 437/230 |
| 4,419,390 | 12/1983 | Feldstein | 437/230 |
| 4,483,711 | 11/1984 | Harbulak et al. | 427/438 |

*Primary Examiner*—Chandra Chaudhari
*Attorney, Agent, or Firm*—Michael E. Schmitt

[57] ABSTRACT

By using an electroless metallization bath to which a stabilizer is added which suppresses the cathodic partial reaction, pyramid-shaped bumps (53) can be grown on the bond pads of semiconductor devices without lateral overgrowth of the coating layer 3. The angle of inclination a is a function of the concentration of the stabilizer.

10 Claims, 1 Drawing Sheet

METHOD OF MANUFACTURING A SEMICONDUCTOR DEVICE BY FORMING PYRAMID SHAPED BUMPS USING A STABILIZER

The invention relates to a method of manufacturing a semiconductor device comprising bond pads which, after an activation treatment, are provided with metal bumps in an electroless metallization process.

BACKGROUND OF THE INVENTION

Wet-chemical processes play an important role in the manufacture of electronic components, both in the removal (etching) and in the deposition of materials (plating). When semiconductor devices (ICs and LSIs) are mounted on a circuit, the bond pads of the semiconductor devices are provided with projecting metal contacts (so-called bumps), after which these bumps are connected to the circuit by bonding, welding, soldering or thermocompression (so-called flip chip principle). By TAB (tape automated bonding) ICs can be provided on a flexible tape comprising circuits.

Such a method is known from European Patent Application EP-A 308971. A semiconductor device comprising aluminium bond pads is first subjected to an activation treatment with an aqueous palladium-salt solution and then provided with nickel bumps. For this purpose, an electroless nickel bath is used.

Such electroless metallization processes are, in principle, isotropic, i.e. the deposition rate of the metal is equal in all directions. In the case of substrates comprising a thin coating layer in which apertures are formed which define the bond pads and which are to be metallized, lateral overgrowth of the coating layer takes place in the metallization process as soon as the metal layer has completely filled the aperture in the coating layer. In the case of semiconductor devices, the coating layer (also termed passivating layer) consists mostly of $SiO_2$ or $Si_3N_4$. The metal bumps project from the coating layer and, as a result of lateral overgrowth, partly cover the coating layer. As a result of the increasing miniaturization the risk of a short-circuit between adjacent bumps increases.

SUMMARY OF THE INVENTION

One of the objects of the invention is to suppress and even preclude the above-mentioned lateral overgrowth of the coating layer.

According to the invention, this object is achieved by a method as described in the opening paragraph, which method is characterized in that the bumps are provided in the form of a pyramid having flat faces by using an electroless metallization bath to which a stabilizer is added in an effective concentration. Electroless metallization baths contain metal ions and a reducing agent. During the metallization process, reduction of the metal ions to metal (the so-called cathodic partial reaction) and, simultaneously, oxidation of the reducing agent take place. The stabilizer which is added in accordance with the invention has the property that the reduction of the metal ions is suppressed. The presence of such a stabilizer leads to anisotropic metallization of the bond pads, as a result of which pyramid-shaped bumps having flat faces are formed, while lateral overgrowth of the coating layer is precluded. It is assumed that the anisotropic metallization is caused by differences in mass transport of the stabilizer. The edges of the bond pad to be metallized are subject to a larger mass transport than the center of the pad. By adjusting the concentration of the stabilizer it becomes possible to poison the edges of the bond pad, so that metallization is precluded at the edges, but continues in the center of the pad. Continuous metallization leads to a further lateral diffusion of the stabilizer towards the center of the growing bond pad, as a result of which the growth of the surface area decreases as a function of time. The result is a metal pyramid having flat faces. Faces are to be understood to mean herein the oblique faces and the upper face. Lateral overgrowth of the coating layer does not take place.

An embodiment of the method according to the invention is characterized in that a lead salt is used as the stabilizer. The lead salt must be dissolvable in the electroless metallization bath. Suitable lead salts are, for example, lead acetate and lead nitrate.

Another suitable embodiment of the method according to the invention is characterized in that a cadmium salt is used as the stabilizer. Suitable cadmium salts are, for example, cadmium acetate and cadminium nitrate.

An embodiment of the method according to the invention is characterized in that the concentration of the stabilizer is 0.1–1.5 mg per liter. Higher concentrations lead to a complete discontinuation of the metallization process. Lower concentrations lead to isotropic growth of the bond pads and, hence, to lateral overgrowth of the coating layer.

A suitable electroless metallization bath is, for example, a nickel bath comprising a nickel salt, succinic acid and hypophosphite in water. Other metals which can be electrolessly deposited are, for example, copper and gold.

If necessary, the metal bumps can be provided with a thin coating of gold, tin, copper or solder. The materials are more ductile than electroless nickel and enhance the soldering process with the circuit to be connected.

BRIEF DESCRIPTION OF THE DRAWINGS

The invention will be explained in greater detail by means of exemplary embodiments and with reference to the drawings, in which FIG. 1 diagrammatically shows a part of a cross-section of a semiconductor device having bumps obtained by the method according to the state of the art, FIG. 2 diagrammatically shows a part of a cross-section of a semiconductor device comprising bumps obtained by the method according to the invention, FIG. 3 diagrammatically shows a part of a cross-section of a semiconductor device comprising bumps obtained by the method according to the invention, and FIG. 4 diagrammatically shows a part of a cross-section of a semiconductor device comprising bumps on aluminium bond pads, said bumps being obtained by the method according to the invention.

DESCRIPTION OF THE INVENTION

Exemplary embodiment 1. (not according to the invention).

Figure 1:
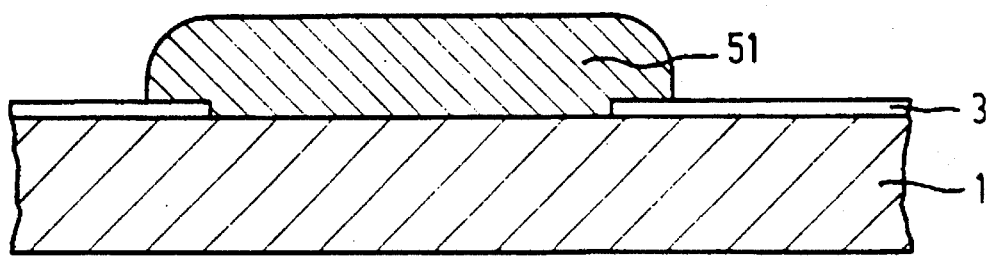

FIG. 1 diagrammatically shows a part of a cross-section of a semiconductor device, in which reference numeral 1 denotes a $n^+$ silicon substrate on which a 0.7 μm thick $SiO_2$ layer 3 is provided in a customary manner (for example CVD or spin-on-glass). Recesses having dimensions of 100× 100 μm are lithographically formed in the layer 3. The silicon surface is activated by palladium nuclei by means of an electrochemical exchange reaction in a diluted $PdCl_2$/HF solution. The activation bath contains per liter 5 mg of $PdCl_2$ 175 µl of concentrated HCl, 1% of HF and is used at a temperature of 70° C. for 60 seconds. After rinsing with water, the silicon substrate is immersed in an acid electroless nickel bath having the following composition:

0.07 mol/l of nickel sulphate 0.01 mol/l of nickel acetate 0.1 mol/l of succinic acid 0.1 mol/l of $H_3PO_2$, Using ammonium hydroxide, the pH-value is adjusted to 4.5. The temperature of the bath is 90° C. Under these conditions, the deposition rate is 20/µm per hour. The residence time of the silicon substrate in the bath is 20 minutes, so that the nickel layer formed (bump 51) has a thickness of approximately 7/µm. Due to the absence of a stabilizer in the electroless nickel bath, the degree of lateral overgrowth on the $SiO_2$ layer 3 is comparable to the layer thickness, which is a result of the isotropic character of the metallization process.

Exemplary embodiment 2.

Figure 2:
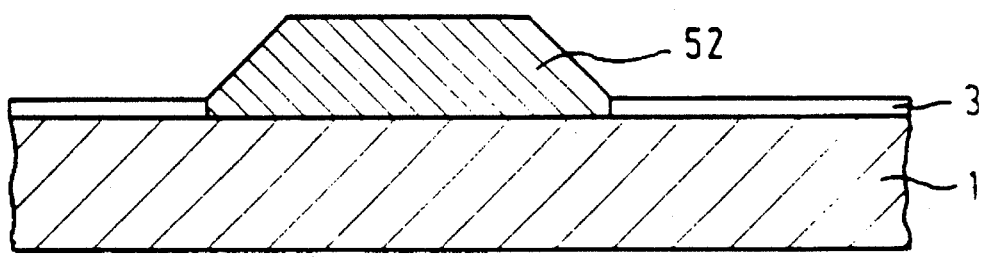

Exemplary embodiment 1 is repeated, with this difference that the electroless nickel bath also contains 0.5 mg/l of lead acetate as the stabilizer. In this case, the nickel bump formed has the shape of a truncated pyramid 52 (FIG. 2) the faces of which are flat. Lateral overgrowth of the $SiO_2$ coating layer 3 does not take place.

Exemplary embodiment 3.

Figure 3:
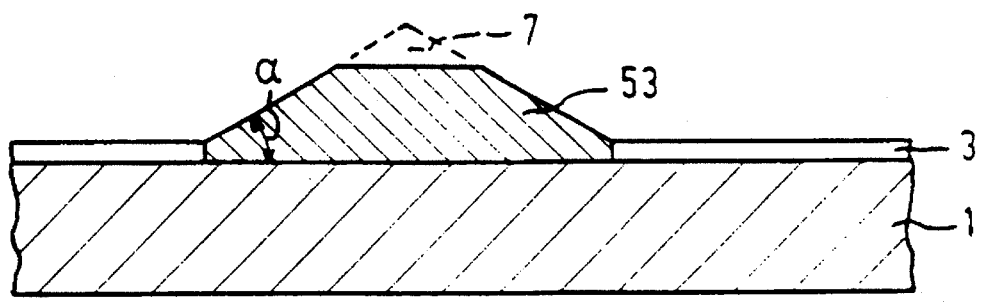

Exemplary embodiment 1 is repeated, with this difference that 1.5 mg/l of lead acetate is added to the electroless nickel bath. The nickel bump formed has the shape of a truncated pyramid 53 (FIG. 3) having flat faces and the angle of inclination α enclosed by the oblique faces and the silicon substrate 1 being smaller than the angle obtained in accordance with exemplary embodiment 2. If the metallization process is continued (i.e. in this case longer than 20 minutes) a pyramid without truncation will be formed (see dotted line 7 in FIG. 3), after which metallization stops. Lateral overgrowth does not take place.

Exemplary embodiment 4.

Exemplary embodiment 1 is repeated with a lead-acetate concentration of 2 mg/l in the electroless nickel bath. In this case, no nickel deposition at all takes place. This is also the case when the lead-acetate concentrations exceed 2 mg/l. At said concentrations, the surface to be metallized is completely poisoned.

Exemplary embodiment 5.

Figure 4:
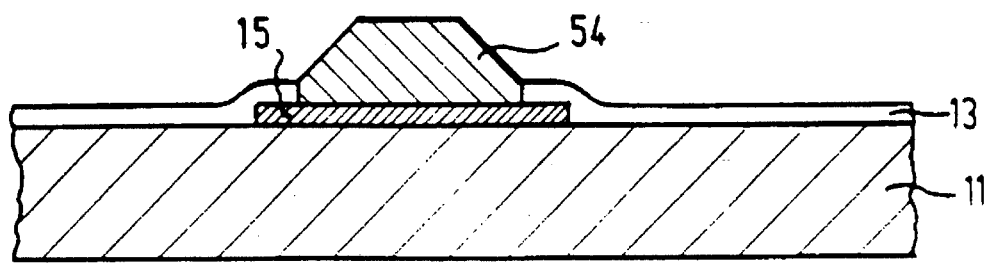

FIG. 4 diagrammatically shows a part of a cross-section of a semiconductor device. Said device comprises a silicon substrate 11, a sputtered aluminium bond pad 15 having a thickness of 0.5µm and dimensions of 100×100 A 0.7 µm thick $SiO_2$ layer 13 is present on the substrate 11, in which $SiO_2$ layer an aperture is lithographically formed at the location of the aluminjure bond pad 15. The aluminium surface is activated with a aluminium solution as described in United States Patent U.S. 4,205,099. The natural oxide skin of the aluminium is removed and replaced by a very thin zinc film (not shown). Subsequently, the zinc is substituted by the nobler nickel in an electroless nickel bath according to exemplary embodiment 1. Lead acetate is added to the nickel bath in a quantity of 1 mg/l. After 20 minutes a nickel bump 54 has formed which has the shape of a truncated pyramid with flat faces and which does not exhibit lateral overgrowth of the $SiO_2$ coating layer 13.

I claim:

1. A method of manufacturing a semiconductor having bond pads comprising the steps of:

(a) forming metal bond pads on a surface of a semiconductor device, (b) covering said surface with an insulating layer having openings to said bond pads, (c) activating said bond pads through said openings, (d) forming metal bumps on said bond pads through said openings by an electroless metallization bath, and (e) preventing overgrowth of said metal bumps beyond said openings by adding a stabilizer to said metallization bath in an effective concentration to form said metal bumps into a shape of pyramids.

2. A method according to claim 1, wherein a lead salt is added as said stabilizer.

3. A method according to claim 2, wherein said stabilizer is added in a concentration ranging from 0.1–1.5 mg per liter.

4. A method according to claim 2, wherein said electroless metallization bath is a nickel bath.

5. A method according to claim 1, wherein a cadmium salt is added as said stabilizer.

6. A method according to claim 5, wherein said stabilizer is added in a concentration ranging from 0.1–1.5 mg per liter.

7. A method according to claim 5, wherein said electroless metallization bath is a nickel bath.

8. A method according to claim 1, wherein said metal bumps are formed in a shape of truncated pyramids having flat faces.

9. A method according to claim 8, wherein said truncated pyramids have side faces forming an angle of inclination with said surface.

10. A method according to claim 9, wherein said angle of inclination decreases upon increasing concentration of said stabilizer.

* * * * *